(12) United States Patent
Voldman (10) Patent No.: US 6,628,159 B2
(45) Date of Patent: *Sep. 30, 2003

(54) SOI VOLTAGE-TOLERANT BODY-COUPLED PASS TRANSISTOR

(75) Inventor: Steven H. Voldman, South Burlington, VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/398,840

(22) Filed: Sep. 17, 1999

(65) Prior Publication Data

US 2001/0043112 A1 Nov. 22, 2001

(51) Int. Cl.[7] .................................................. H03K 3/01
(52) U.S. Cl. ....................................... 327/534; 327/537
(58) Field of Search ............................. 327/112, 530, 327/534, 535, 537, 434, 108, 427; 257/355, 356–358, 360, 363; 326/83, 81, 86; 361/56, 86, 88, 90, 91.1, 91.5

(56) References Cited

U.S. PATENT DOCUMENTS

| | | | |
|---|---|---|---|
| 3,947,727 A | * 3/1976 | Stewart | 361/91.5 |
| 4,037,140 A | * 7/1977 | Eaton, Jr. | 361/56 |
| 4,256,977 A | 3/1981 | Hendrickson | 327/434 |
| 5,103,277 A | 4/1992 | Caviglia et al. | 257/348 |
| 5,157,291 A | * 10/1992 | Shimoda | 327/434 |
| 5,262,689 A | 11/1993 | Glica et al. | 327/108 |
| 5,314,841 A | * 5/1994 | Brady et al. | 438/517 |
| 5,321,293 A | 6/1994 | Mojardi et al. | 257/357 |
| 5,510,747 A | 4/1996 | Williams | 327/434 |
| 5,557,231 A | 9/1996 | Yamaguchi et al. | 327/534 |
| 5,594,371 A | 1/1997 | Douseki | 326/119 |
| 5,596,297 A | * 1/1997 | McClure et al. | 327/530 |
| 5,610,533 A | 3/1997 | Arimoto et al. | 327/537 |
| 5,682,050 A | 10/1997 | Williams | 327/537 |
| 5,689,209 A | * 11/1997 | Williams et al. | 327/534 |
| 5,748,016 A | 5/1998 | Kurosawa | 327/534 |
| 5,811,857 A | * 9/1998 | Assaderaghi et al. | 257/355 |
| 5,814,899 A | 9/1998 | Okumura et al. | 327/534 |
| 5,829,260 A | 11/1998 | Kojima et al. | 62/148 |
| 5,838,047 A | 11/1998 | Yamauchi et al. | 327/537 |
| 5,892,260 A | 4/1999 | Okumura et al. | 327/534 |
| 5,917,365 A | * 6/1999 | Houston | 327/534 |
| 5,952,848 A | * 9/1999 | Morris | 326/83 |
| 6,020,778 A | * 2/2000 | Shigehara et al. | 327/534 |
| 6,094,068 A | * 7/2000 | Normura et al. | 327/534 |
| 6,111,455 A | * 8/2000 | Eleyan et al. | 327/534 |
| 6,208,195 B1 | * 3/2001 | Wyland | 327/434 |

* cited by examiner

Primary Examiner—Terry D. Cunningham
Assistant Examiner—Long Nguyen
(74) Attorney, Agent, or Firm—McGinn & Gibb, PLLC; Richard A. Henkler, Esq.

(57) ABSTRACT

A method and device for A pass transistor device which includes a source; a drain opposite the source, a body between the source and the drain, and a circuit control network connected between the drain and the source, wherein the circuit control network controls a potential voltage of the body and provides overvoltage protection to the pass transistor.

15 Claims, 8 Drawing Sheets

SOI VOLTAGE-TOLERANT BODY-COUPLED PASS TRANSISTOR

BACKGROUND OF THE INVENTION

1. Field of the Invention

The invention generally relates to transistor devices which have a dynamic threshold and more particularly to a dynamic threshold device which has increased current capabilities.

2. Description of the Related Art

Silicon-On-Insulator (SOI) technology, which is becoming of increasing importance in the field of integrated circuits, deals with the formation of transistors in a relatively thin layer of semiconductor material overlying a layer of insulating material. Devices formed on SOI offer many advantages over their bulk counterparts, including: higher performance, absence of latch-up, higher packing density, low voltage applications, etc. However, SOI circuits, like other electronic circuits, are: First, susceptible to electrostatic discharge (ESD), a surge in voltage (negative or positive) that occurs when a large amount of current is applied to the circuit; and second, in need of providing an ideality (a constant voltage swing of 60 mV/decade over several decades of current) for analog applications, such as in phase-locked-loop circuits, voltage regulators, and band gap reference circuits.

For ESD applications, to discharge ESD impulses, ESD protection schemes need a low voltage turn-on and a high current drive (the ability to generate or sink a large amount of current before a large amount of negative or positive voltage is developed). Traditional bulk overvoltage protection schemes, such as diode circuits, do not work well on SOI because of the presence of the SOI buried oxide. That is, conventional diodes on SOI have small current drivability because the current is carried laterally and is limited by the thickness of the semiconductor material. Thus, developing a new approach or a new type of diode was necessary for adequate ESD protection for SOI circuits.

ESD robustness is important for SOI driver (buffer) and receiver circuits. Receiver circuits, pass transistors, test transistors, feedback keeper elements and other auxiliary transistors on input pins must be overvoltage tolerant to protect from ESD events, electrical overstress, and other high current and voltage conditions. Hence, robust elements are needed to provide ESD robust SOI receiver circuits. Input/output (I/O) networks and off-chip drivers must also provide ESD robust pull-up and pull down elements. Hence, n-channel or p-channel SOI transistors, used as both pull-up or pull-down elements must provide over-shoot and undershoot protection, electrical overstress protection and ESD protection.

An I/O circuit is very susceptible to gate overstress, overvoltage and electrostatic discharge/electrical overstress events. The pass transistor, typically used in receiver networks, bi-directional circuits and other applications is extremely useful in protecting against overvoltage and electrostatic discharge events.

For overvoltage events, there are both positive and negative overshoot concerns that are typically addressed for receiver networks. For ESD events, there are both positive and negative events that occur on both the source and drain of the pass transistor (input or output side). Human body model (HBM) and machine model (MM) events occur on the pad side of the structure. Charged device model (CDM) events can occur on the receiver side. In all cases, voltage across the pass transistor that allows it to undergo secondary breakdown is a concern. In SOI technologies, there is also a concern that the diode is not formed relative to the bulk substrate. This prevents the operation of diode action relative to the bulk for negative undershoot or negative mode ESD phenomenon.

SUMMARY OF THE INVENTION

In one aspect, the invention provides a structure, method and apparatus which uses a body-limiting network in an ESD device on SOI chips. The invention uses a body-charging network to produce a more robust ESD. The invention uses an SOI body-augmenting network which modulates an SOI body potential and provides a more robust ESD network. The invention provides RC discrimination and a body-limiting network in an ESD network on an SOI chip. The invention also provides RC discrimination and body-charging networks in an ESD network.

The invention includes RC discrimination and a SOI-body augmented network in an ESD network. The invention provides a RC discrimination-body controller, a body-modulation network, a SOI body-augmenting network, and a body-charging network, all for a half-pass transistor.

Thus, the invention provides a structure and method for a pass transistor device which includes a source, a drain opposite the source, a body between the source and the drain, and a circuit control network connected between the drain and the source (the circuit control network controls a potential voltage of the body and provides overvoltage protection to the pass transistor). The circuit control network includes a body-charging element. The body-charging element includes a Lubistor, a body- and gate-coupled silicon over insulator (SOI) diode element, at least one Lubistor, a silicon over insulator (SOI) metal oxide silicon field effect transistor (MOSFET), and a body- and gate-coupled silicon over insulator (SOI) metal oxide silicon field effect transistor (MOSFET) diode. The circuit control network includes a body-limiting element and a voltage divider network. The voltage divider includes at least one resistor. The resistor includes a buried resistor element and a silicon over insulator (SOI) metal oxide silicon field effect transistor (MOSFET). The circuit control network includes at least one resistor-capacitor series configured element whose center node is connected to the SOI body of the pass transistor.

Another embodiment of the invention is a silicon over insulator (SOI) metal oxide silicon field effect transistor (MOSFET) device which includes a body, a gate opposite the body, a resistive/capacitor discriminator connected to the gate, and a circuit control network connected to the body (wherein a potential voltage of the body is modulated by the control circuit network to provide electrostatic discharge (ESD) protection). The control circuit is connected to the gate, modulates the potential voltage of the body, and limits the body to a reference voltage. The control circuit includes at least one SOI MOSFET, at least one ESD SOI diode, at least one body/gate-coupled SOI diode, and n-channel and p-channel SOI MOSFETs, at least two RC discriminators and at least one control circuit network. The device further includes an input pad connected to the gate, a drain adjacent the gate, and a source opposite the drain (wherein the control network is connected to the input pad and the drain and the source is connected to Vss).

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

As mentioned above, ESD protection is becoming increasingly important in current technologies. Convention ESD protection devices can be destroyed if there are forced to accept excessive current. The invention described below allows an improved ESD robust network.

One approach to solving the aforementioned problems, mentioned in U.S. Pat. No. 5,811,857 to Assaderaghi et al. (hereinafter Assaderaghi) which is incorporated herein by reference, discloses a body-coupled gated (B/G-C) diode formed from an (SOI) field-effect transistor (FET). In this structure, the body, gate and drain of the SOI FET are tied together, forming the first terminal of the B/G-C diode. The source of the SOI FET forms the second terminal of the B/G-C diode. Both NFETs and PFETs may be used to create the forward-biased operation of the B/G-C diode.

However, the device disclosed in Assaderaghi is limited to operating in a diodic mode. Assaderaghi is an example of application of a dynamic threshold technique applied to an SOI MOSFET and configures in a diode-configuration. To the contrary, the invention utilizes body-coupled devices in a wide variety of circuit structures.

Figure 1:
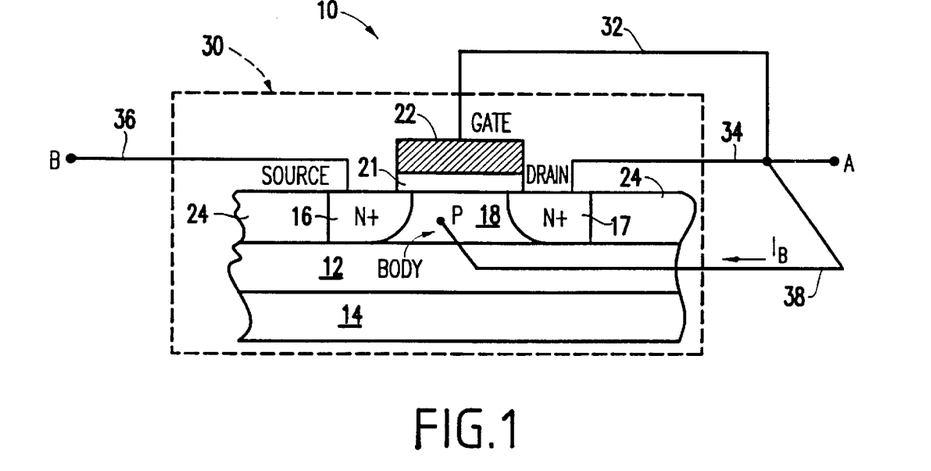
FIG. 1 is a schematic diagram of a body-coupled gated diode.

One configuration of a B/G-C diode is shown in FIG. 1. More specifically, FIG. 1 illustrates an NFET B/G-C diode 10 that is formed from an SOI MOSFET 30 having an isolation region 24, buried oxide 12, and silicon substrate 14. Two N+ regions are formed, a source region 16 and a drain region 17, on a P-type body region 18. A gate electrode 22 overlies a gate insulator 21 and defines the gate of the MOSFET 30. A surface channel 23 lies below gate insulator 21 and on the surface of the P-type region 18, wherein the P-type region is also known as the channel. The source 36, drain 34, body 38 and gate 32 terminals are affixed to the source region 16, drain region 17, body node region 18 and gate electrode 22, respectively. Terminal A, coupled to the body 38, drain 34, and gate 32 terminals, and terminal B, coupled to the source terminal 36, form the input and output of an N+/P type B/G-C diode 10. Although not shown, the connections of the terminals can be easily done at any of the metal layers of MOSFET 30.

Figure 2:
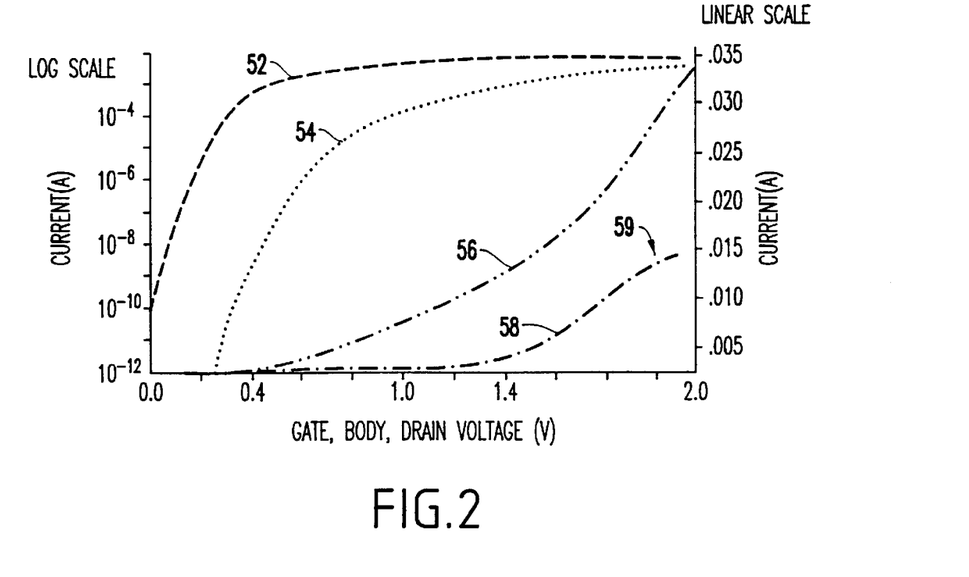
FIG. 2 is a graph of the measured characteristics of the voltage vs. the current in the structure shown in FIG. 1.

The operation of the MOSFET B/G-C diode shown in FIG. 1 takes place in two current regions, as illustrated in greater detail in FIG. 2. In the first current region, the B/G-C diode provides ideal diode characteristics. In the second current region the B/G-C diode provides ESD protection. In general, the first current region of the B/G-C diode corresponds to the functional voltage range from approximately 0 volts to approximately Vdd, wherein Vdd is the power supply voltage. The exponential portion of diode characteristics, though, is typically limited to zero to approximately +/−0.7 volts because of external and parasitic series resistances. The second current region of the B/G-C diode corresponds to the range approximately below zero and above the power supply voltage, Vdd.

For the second current region, ESD protection is provided under two turn-on conditions of the MOSFET B/G-C diode. The first turn-on condition occurs when the voltage of the body 38 exceeds the voltage of the source 36. When this condition occurs, a forward-biased diode attribute allows a current flow from the body terminal to the source terminal.

The second turn-on condition occurs when the voltage at the gate 32 exceeds the threshold voltage. That is, as the signal pad voltage increases, the body voltage and the gate voltage will also increase. When the body voltage increases, the threshold voltage decreases. Thus, when the gate voltage exceeds the threshold voltage, current will flow from the drain terminal to the source terminal.

Thus, for the NFET B/G-C diode 10 (FIG. 1), when a positive pulse is applied to the terminal of the NFET (terminal A), the current is discharged through the P-N diode formed by the body 18 and source 16 of the NFET structure. In parallel, as the body voltage increases, the threshold voltage of the MOSFET 30 decreases, creating a dynamic threshold and ideal diode characteristics. As the threshold voltage of the NFET decreases, the gate-coupling of the NFET turns on the NFET in parallel with the diode. A unique aspect of the B/G-C diode is the parallel operation of diode characteristic of the diode and the body and gate coupled MOSFET interaction. The B/G-C diode uses body-coupling to lower the absolute value of the threshold voltage and gate-coupling to turn on the ESD MOSFET element prior to NFET snapback.

Likewise, for a PFET B/G-C diode which is also illustrated and discussed in Assaderaghi, when a negative pulse is applied to the terminal of the PFET (terminal A), the current is discharged through the N-P diode formed by the body and drain of the PFET structure. In parallel, as the body voltage decreases, the magnitude of the threshold voltage of the PFET decreases, again creating a dynamic threshold and ideal diode characteristics. As the threshold voltage of the PFET decreases, the gate-coupling of the PFET turns on the PFET in parallel with the diode.

A distinguishing aspect of the B/G-C diode as compared to other diodes is the parallel operation of diodic characteristic of the diode and the body 25 and gate coupled MOSFET interaction. That is, the B/G-C diode uses body-coupling to lower the absolute value of the threshold voltage and gate-coupling to turn on the ESD MOSFET element prior to FET snapback.

FIG. 2 illustrates the operation of the NMOSFET B/G-C diode 10 (lines 52 and 56) compared to the operation of a non-B/G-C diode (lines 54 and 58). On the left vertical axis of the graph is a log scale of the current at the first current region (pertaining to lines 52 and 54), indicating the subthreshold regions of MOSFET 30 (line 52) and the FET of the non-B/G-C diode (line 54). The other vertical axis of the graph illustrates the linear scale of the current at the second current region (pertaining to lines 56 and 58), indicating the ESD operational mode of MOSFET 30 (line 56) and the FET of the non-B/G-C diode (line 58).

At the first current region, the B/G-C diode (line 52), unlike the non-B/G-C diode (line 54), attains an ideal subthreshold swing of 60 mV/decade. This identity is possible through the coupling of the body to the gate of MOSFET 30. That is, the gate voltage is directly applied to the body instead of being capacitively coupled, as with the conventional non-B/G-C diode.

The B/G-C diode, with an identity factor of 1, produces a 60 mV/decade slope (line 52), and the non-B/G-C diode, with an identity factor of approximately 1.45, produces a slope of around 87 mV/decade (line 54). As aforementioned, a 60 mV/decade slope is important in analog applications for functions such as voltage reference, phase-locked-loop, and voltage regulators.

At the second current region (lines 56 and 58), the ESD protection provided by the non-B/G-C (line 58) diode is minimal, quickly being dominated by series resistance 59, where the voltage begins to increment proportionally to the current. The ESD protection provided by the B/G-C diode is much greater (line 56). The B/G-C MOSFET at this point may be conceptually treated as a bipolar device with large (and sometimes infinite) current gain. The drain current can be modeled as the collector current, and the body (gate) current as the base current. Even though for ease of analysis this device may be treated as a bipolar device, it is indeed a MOSFET since the current conduction is through the surface channel and is controlled by the gate. The "apparent" gain of the "bipolar" device is large, because the threshold voltage (Vt) of the MOSFET is being modulated by the applied bias to the silicon film. This gives the appearance of large bipolar gain at low biases.

Figure 3:
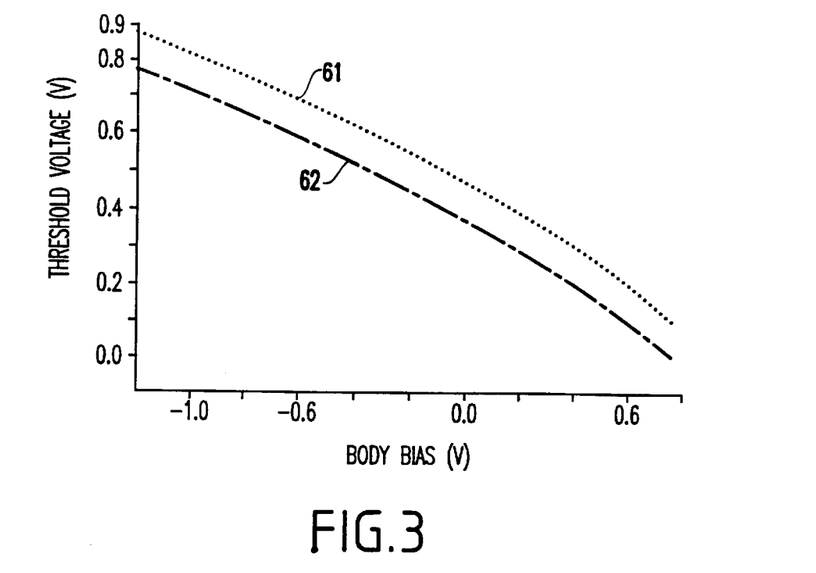
FIG. 3 is a graph of the characteristics of the threshold voltage vs. the body bias of the structure shown in FIG. 1.

FIG. 3 demonstrates the modulation of the threshold voltage by the applied body bias. The modulation of two devices is depicted. One of the devices has a shorter channel length than the other. Line 61 illustrates when $L_{drawn}$, the drawn dimensions of the channel length, is equal to 0.25 $\mu$m, and line 62 illustrates when $L_{drawn}$ is equal to 0.20 $\mu$n. Thus, the B/G-C diode uses body-coupling to lower the absolute value of the threshold voltage and create a dynamic threshold. Consequently, control of the threshold voltage allows for excellent control of the diode characteristics. Furthermore, by changing Vt-adjust implants (implants that are utilized to control the threshold voltage) of a MOSFET, the I off the B/G-C diode (e.g., Ioff of the MOSFET) can easily be changed by several orders of magnitude. This change is depicted by moving line 52 to the left or right, which is not easily accomplished in regular diodes.

Carrying the bipolar analogy one step further, it becomes clear why connecting the collector and base together will form a diode. Here, the gate and the body may form the base terminal, the drain may be the collector terminal, and the source may be the emitter terminal. Even though the base (gate) current might have non-identity, its sum with the collector current will remain ideal because the collector current is several orders of magnitude larger than the base current. As seen, this diode will have a much larger current than the conventional diode of the same size.

SOI MOSFETS achieve an ESD robustness of less than 1V/$\mu$m with the gate floating, and approximately 1V/$\mu$m with the gate grounded. Conventional lateral diode elements reach a limit of EDS robustness of 5V/$\mu$m in 5 S, 6.5V/$\mu$m in 6 S and 11V/$\mu$m in 7 S. With the body coupled and gate coupled structures described below, the ESD robustness of the inventive MOSFET achieved 18.8V/$\mu$m. From these results, it is clear that, with the invention, the robustness of pass transistors can be assisted by body coupling. This improves ESD robustness by augmenting the action of the diode elements. The inventive elements provide current bypass to assist in the ESD robustness.

More specifically, in one embodiment, the inventive structure is a pass transistor, which incorporates networks that bias, couple, and set the body voltage during such overvoltage phenomenon. Another embodiment of the invention is a resistor/capacitor (RC) coupled body pass transistor.

Figure 4:
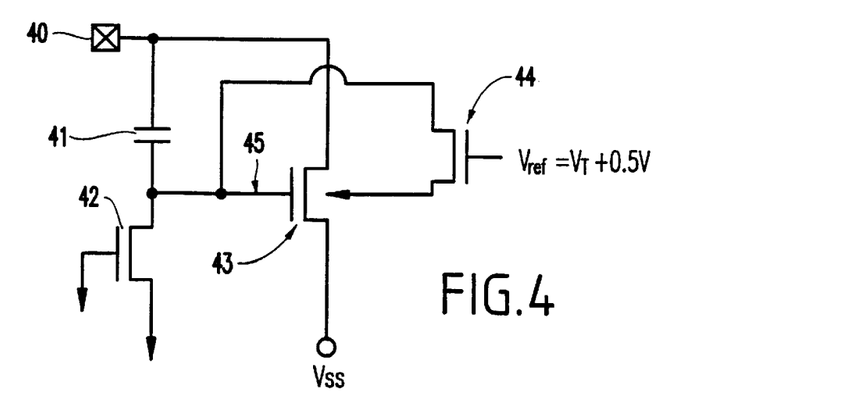
FIG. 4 is schematic diagram of a first network using NFET implementation.

FIG. 4 illustrates a network according to the invention that uses an NFET implementation. In FIG. 4, a pad 40, a capacitor 41, a pass transistor 43, a resistive transistor 42, and element 44, which limits the voltage that the body can rise to and sets the reference voltage, are illustrated. The body 45 of the pass transistor 43 is connected to the input 40 by the RC network (e.g., resistive transistor (e.g., buried resistor) 42 and capacitor 41) such that when a pulsed event occurs (e.g., overvoltage, overcurrent), the voltage of the body 45 rises. This voltage rise of the body element 45 lowers the threshold voltage of the pass transistor 43, which causes the pass transistor 43 to turn on. In this state, the body 45 is dynamically coupled, thereby allowing a higher current drive, a lower turn-on voltage and at the same time, less voltage stress.

Figure 5:
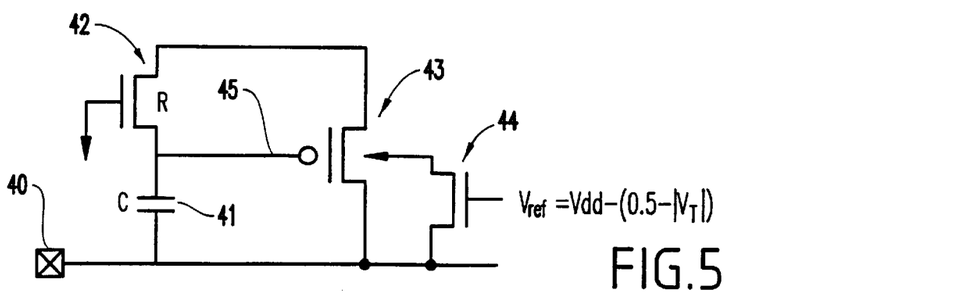
FIG. 5 is schematic diagram of a first network using PFET implementation.

The structure in FIG. 4 is an NFET implementation of the invention. FIG. 5 illustrates a PFET implementation, which operates as described above except, capacitor 41 and resistive transistor 42 initiate RC coupling of the gate 45. Element 44 acts as a voltage reference which limits the body potential to the reference voltage $V_{ref}$. In an ESD event, the RC network couples the gate 45 of the pass transistor 43.

Figure 6:
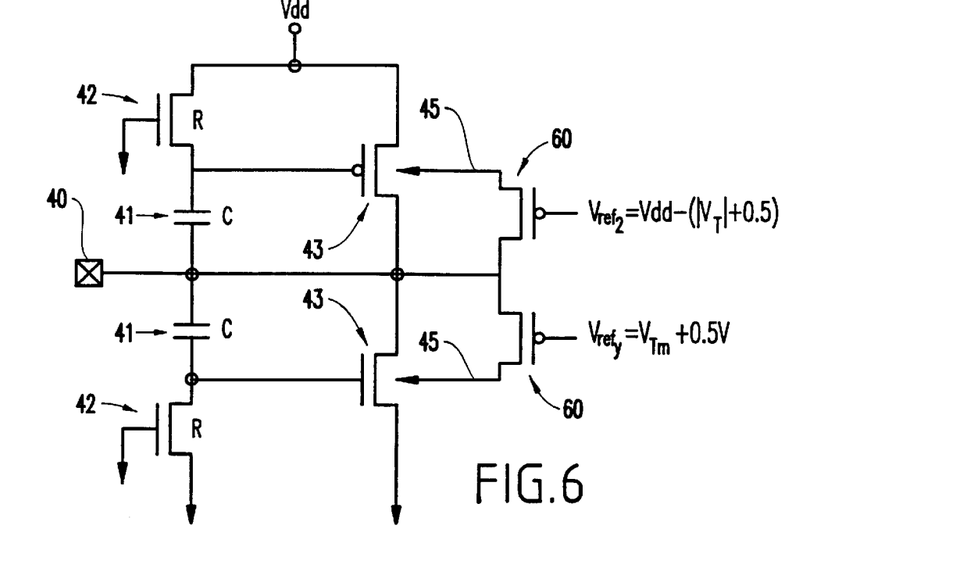
FIG. 6 is a schematic diagram of a PFET/NFET switch with body limiting devices and RC coupling of the gate.

Similarly, FIG. 6 illustrates a PFET/NFET switch which includes RC networks 41, 42 which operate as described above. In addition, the structure in FIG. 6 includes body limiting devices 60 which limit the body voltage during functional operation. In the example shown in FIG. 6, the body limiting devices 60 are coupled to reference voltages of $V_{ref2}$=Vdd−(|$V_{tp}$|+0.5V) and $V_{refy}$=$V_{tm}$+0.5V for the RC networks. The body limiters 60 can be any devices well known to those ordinarily skilled in the art (e.g., NFET, PFET, etc.) that are used to limit voltage or provide a reference voltage.

Figure 7:
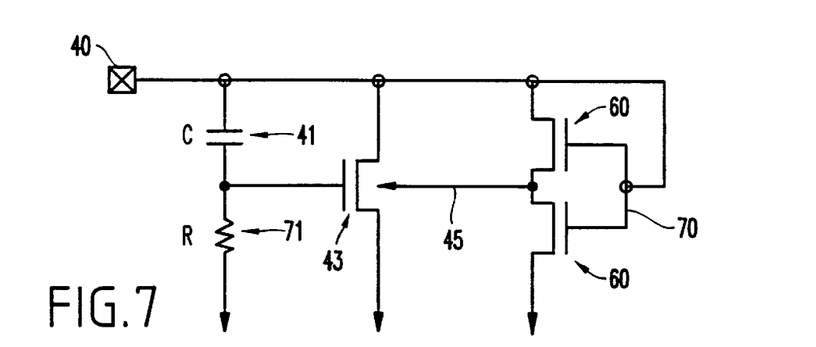
FIG. 7 is a schematic diagram of a body limiter with a resistive divider and gate RC coupling.

FIG. 7 illustrates a similar structure; however, the resistive transistor 42 is replaced with a conventional resistor 71. As would be known by one ordinarily skilled in the art given this disclosure, the resistive transistors 42 and resistors 71 can be generally substituted for one another in the structure disclosed herein. In this implementation, the body voltage is coupled by the two NFET devices 60 in series, forming a resistive divider as well as a second parallel current path. When the pad voltage increases, node 45 rises, increasing the current drive of element 43.

Figure 8:
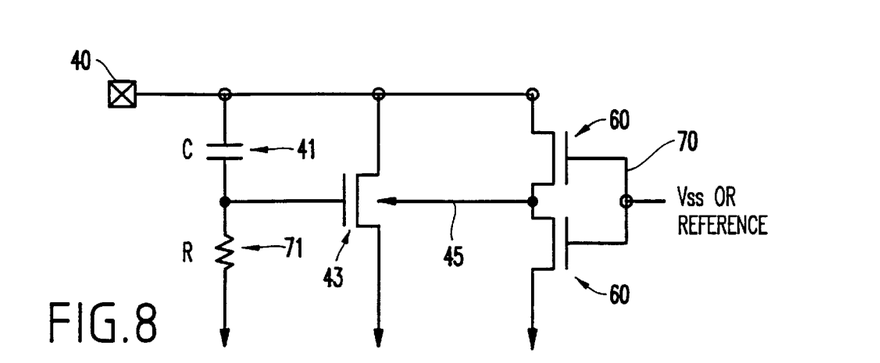
FIG. 8 is a schematic diagram of a body limiter with a resistive divider.

Similarly, in FIG. 8, the structure includes body limiter elements 60. However, in the structure shown in FIG. 8, the gates 70 of the body limiter elements 60 are connected to the voltage source Vss or to a reference voltage. This separates the gates from the pad input node and allows setting the reference values of the elements 60.

Figure 9:
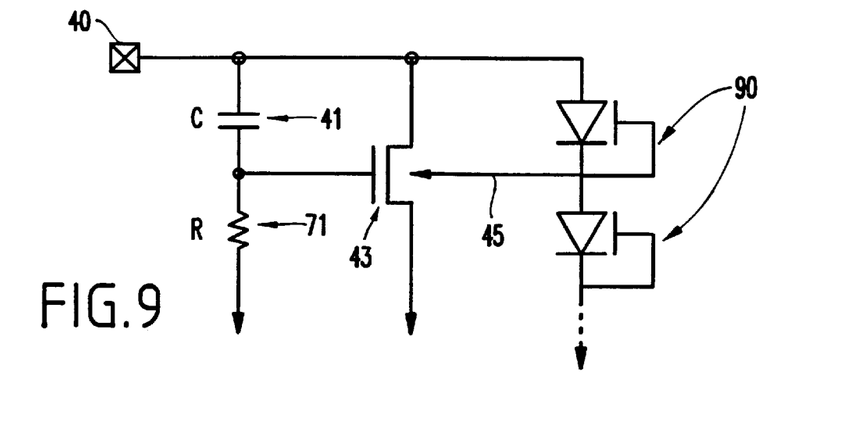
FIG. 9 is a schematic diagram of a resistive divider using polysilicon SOI diodes.

FIG. 9 illustrates a similar structure; however, the body limiter elements comprise lateral unidirectional bipolar transistors 90 (known as Lubistors). Lubistor elements have been shown to provide higher ESD robustness compared to MOSFET structures. The Lubistors cause node 45 to provide body modulation and increased current drive for element 43 as well as to provide an alternative current path.

Figure 10:
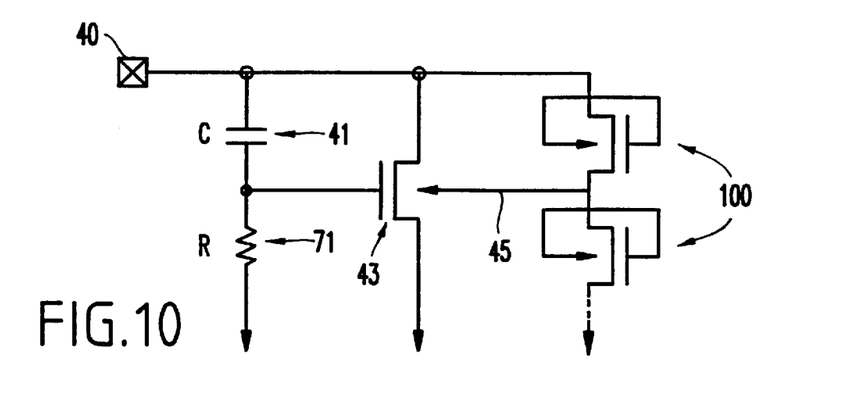
FIG. 10 is a schematic diagram of a resistive divider using dynamic threshold SOI MOSFETs.
Figure 11:
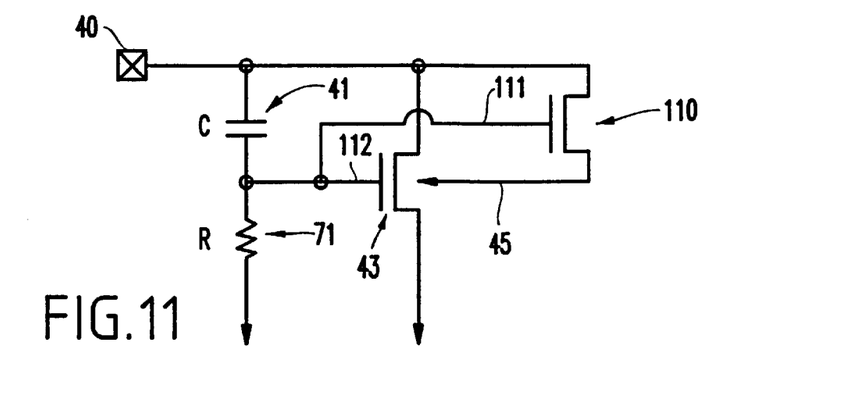
FIG. 11 is a schematic diagram of a body charging device with a body charging element.

FIG. 10 again shows a similar structure; however, the body limiter elements are replaced with dynamic threshold SOI MOSFETs 100. Dynamic threshold B/G-C diodes have lower turn-on voltage than Lubistors. In a similar manner, FIG. 11 illustrates a transistor 110 (e.g., body limiter element) which has its gate 111 connected to the gate 112 of the pass transistor element 43. As the gate 112 rises, the gate of element 111 rises, turning on element 110. This charges the body of element 43, providing increased current drive.

Figure 12:
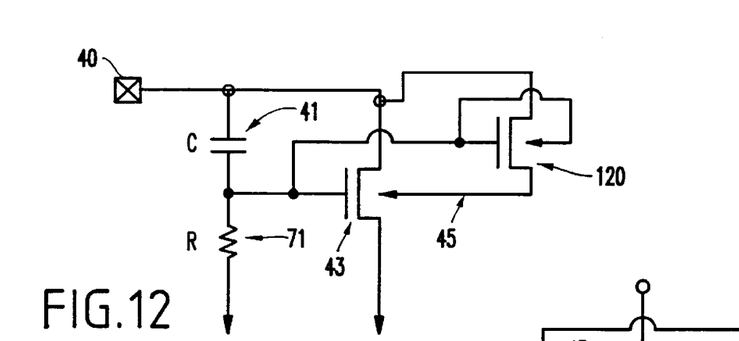
FIG. 12 is a schematic diagram of a body charging device with a B/G-C DTMOS body charging element.

FIG. 12 illustrates a similar structure having body and gate-coupled dynamic threshold device 120 as the body charging elements. In this case, both the gate and body of element 120 rises, having an increased body charging and higher current drive. This causes node 45 to rise faster than the circuit in FIG. 11.

Figure 13:
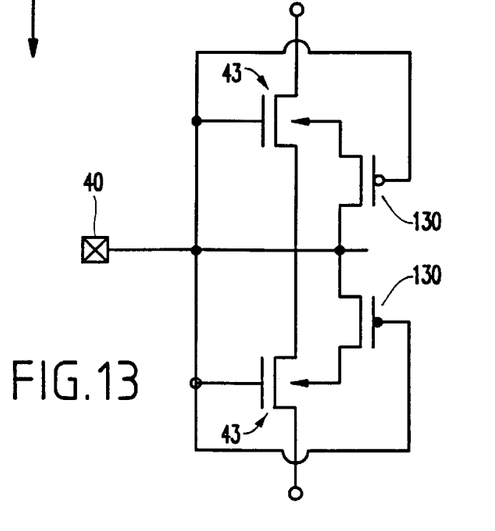
FIG. 13 is a schematic diagram of a body charging with an NFET and PFET clamp network.

FIG. 13 illustrates a clamp network having pass transistors 43, a pad 40 and body charging elements 130 which function in a similar manner as discussed above. As the pad rises, the gate of element 130 rises, causing the element 130 to turn on, charging the body of element 43. For negative pulses, the PFET 130 turns on, causing the element 43 to ground to have its body rise.

Figure 14:
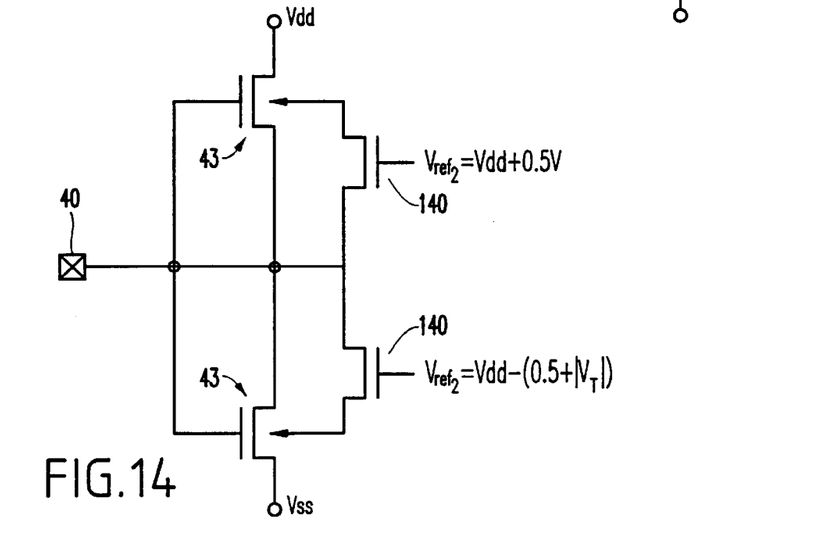
FIG. 14 is a schematic diagram of a body limiter.

FIG. 14 is similar to FIG. 13; however in FIG. 14, the body limiter elements 140 are connected directly to the pass transistors 43. In element 40, the body voltages are limited to the reference levels, $V_{ref1}$ and $V_{ref2}$.

Figure 15:
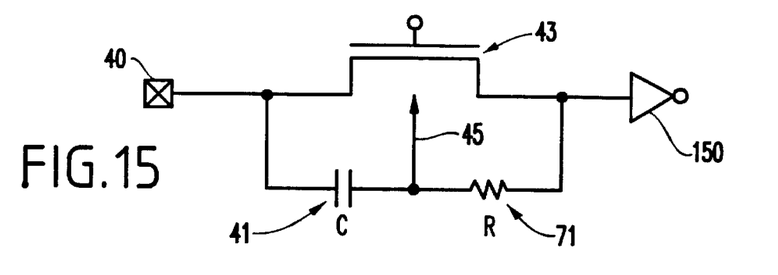
FIG. 15 is a schematic diagram of first embodiment of an RC coupled body pass transistor (half-pass)

FIG. 15 is an equivalent circuit to that shown in FIG. 4 in that the pad 40, capacitor 41, resistor 71 (42) and the pass transistor 43 are illustrated. FIG. 15 also shows the receiver 150. This equivalent circuit is provided to more clearly explain the embodiment of the invention shown in FIG. 16 which is a resistor-divider referenced body pass transistor.

Figure 16:
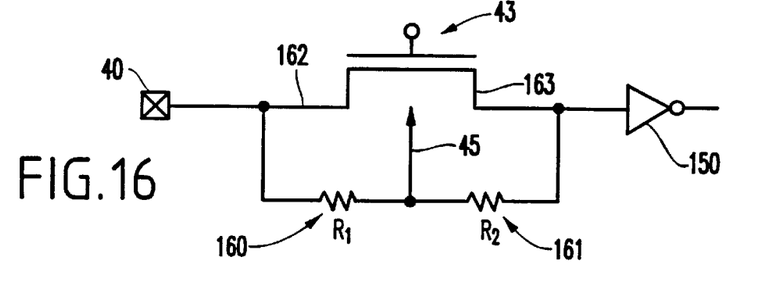
FIG. 16 is a schematic diagram of second embodiment of an RC coupled body pass transistor.

In FIG. 16, the pass transistor 43 is connected between the pad 40 and the receiver 150. A first resistor 160 is placed between the pad 40 and the body element 45. The first resistor 160 is connected between the body 45 and the drain side 162 of the pass transistor 43. A second resistor 161 is placed between the body element 45 and the source side 163 of the pass transistor 43.

As the voltage rises on the pad node 40, the body 45 voltage rises with the pad 40. When the body 45 voltage rises, the threshold voltage of the pass transistor 43 is reduced, reducing the voltage drop across the pass transistor 43. Secondly, the two resistors 160, 161 act as a divider to limit or set the body 45 voltage relative to the pad 40 to reduce voltage stress. At high current, the parallel elements 160, 161 will also provide a second current path to further increase the robustness of the pass transistor element 43.

Figure 17:
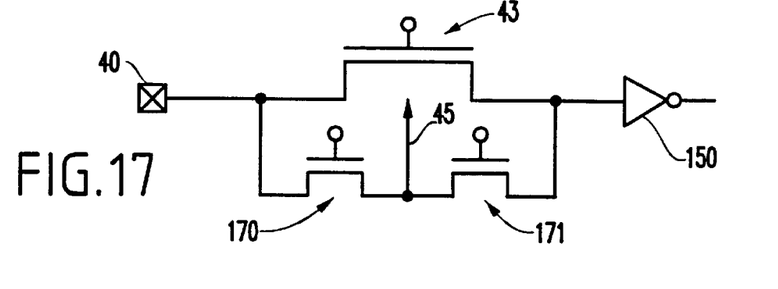
FIG. 17 is a schematic diagram of an alternative to FIG. 16.
Figure 18:
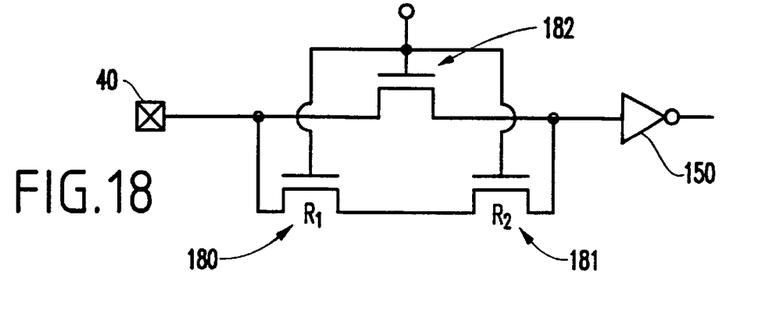
FIG. 18 is a schematic diagram of an alternative to FIG. 16 using NFET implementation.
Figure 19:
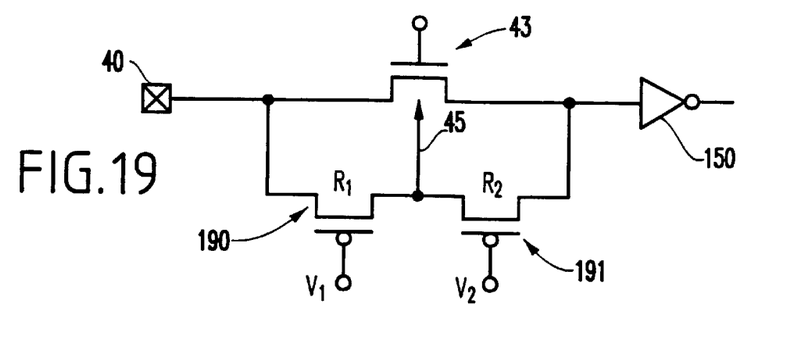
FIG. 19 is a schematic diagram of an alternative to FIG. 16 using PFET implementation.
Figure 20:
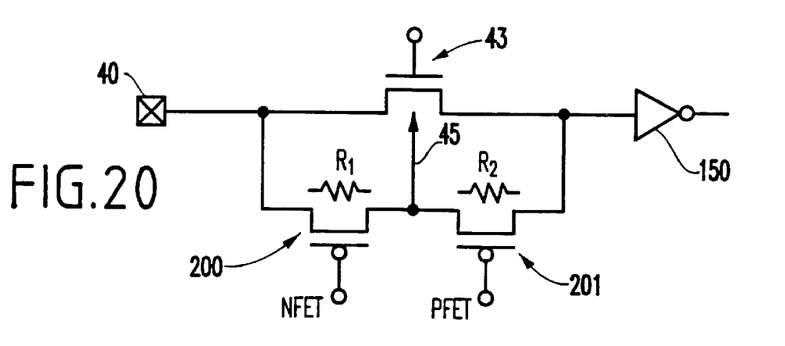
FIG. 20 is a schematic diagram of an alternative to FIGS. 18 and 19 using PFET and NFET implementation.

In an alternative embodiment, the two resistor elements 160, 161 can be two MOSFETs 170, 171, 180, 181 as shown in FIGS. 17 and 18. The gates of the MOSFETs, can be activated by an external pulse, or be turned on by a reference voltage or connected to Vdd. The two MOSFETs can be p-channel or n-channel or one of both. In all cases, the body-biasing network sets the body so that the voltage is defined on the body and rises with the input node. In all cases, the two elements limit the maximum voltage across the pass transistor as well as provide an alternative current path. In FIGS. 17 and 19, these can be independently biased whereas FIG. 18 is activated by gate 182 potential. FIG. 20 is equivalent to FIG. 19 and illustrates that conventional resistors $R_1$, $R_2$ can be used or resistive NFET and PFET transistors 200, 201 can be substituted into the circuit to achieve the same result.

Figure 21:
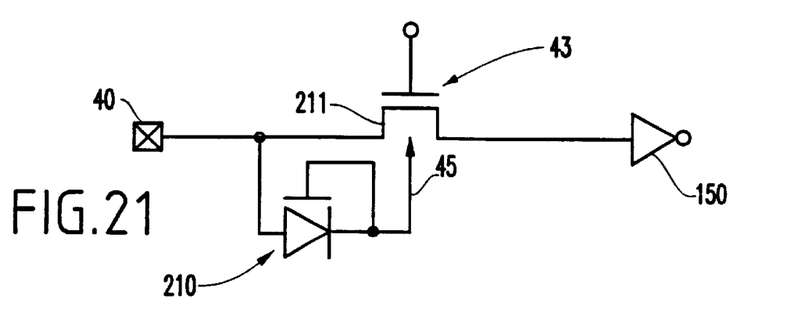
FIG. 21 is a schematic diagram of a first embodiment of a polysilicon gate diode-referenced body pass transistor.

Yet another embodiment of the invention is a polysilicon gated diode-referenced body pass transistor, as shown in FIG. 21. In SOI, lateral diode elements are constructed using a P+ anode, a gate, and an N+ cathode. By using two diodes or more in a series configuration, the voltage level of a pass transistor element can be set for body-biasing and reduced voltage stress. In the embodiment shown in FIG. 21, the pass transistor 43 is between the pad 40 and the receiver 150, and at least one diode 210 is used in parallel with the pass transistor 43.

The diode 210 is a Lubistor or SOI-gated diode and is positioned between the drain 211 and the body 45, so that the diode's anode is at the drain 211 and cathode is at the body 45. As the pad 40 voltage rises, the diode 210 forward biases, increasing the voltage of the body 45. This provides more current drive to the pass transistor 43, lowers its Vt above 0.7 V and provides a second current path in series with the pass transistor drain. The pass transistor body-source junction (45, 211) can act as a diode in series with the poly-bound diode (Lubistor) element 210 so that, at voltages above 1.4 V, the combination acts as two diodes in series. Thus, this network effectively provides a body-coupled MOSFET in parallel with a "series diode string" between the pad and the receiver network.

Figure 22:
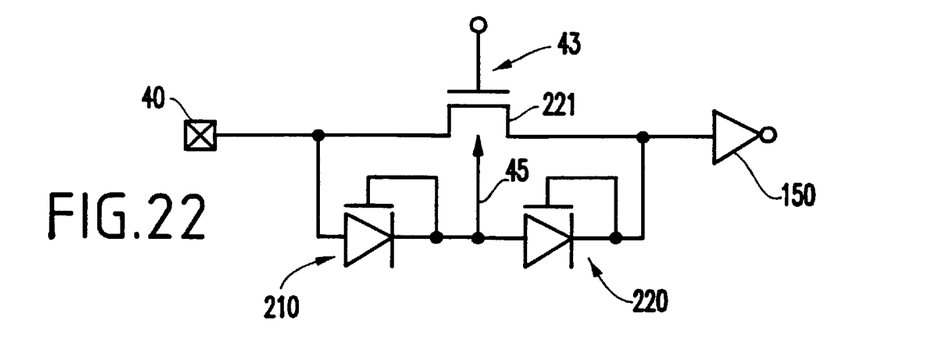
FIG. 22 is a schematic diagram of a second embodiment of a polysilicon gate diode-referenced body pass transistor.

The structure shown in FIG. 22 is similar to that shown in FIG. 21 and includes a second Lubistor or gated diode element 220 connected to the body 45 and the source 221 of the pass transistor 43. This sets the body 45 of the pass transistor 43 as the center node of the two diode elements 210, 220. The body 45 voltage is then set as a reference voltage between the two diode elements. If current flows through the circuit shown in FIG. 22, the center point voltage 43 can be set by the body series resistance as well as the forward voltage potentials. Thus, this circuit produces body coupling of the pass transistor 43 for reduced voltage stress, increased current drive and improved delay, as well as an alternative current path to enhance the pass transistor ESD robustness. In this embodiment, the number of diodes can be varied to make this dynamic threshold metal oxide semiconductor (DTMOS) concept suitable for SOI networks between 1.5 V Vdd and below.

Figure 23:
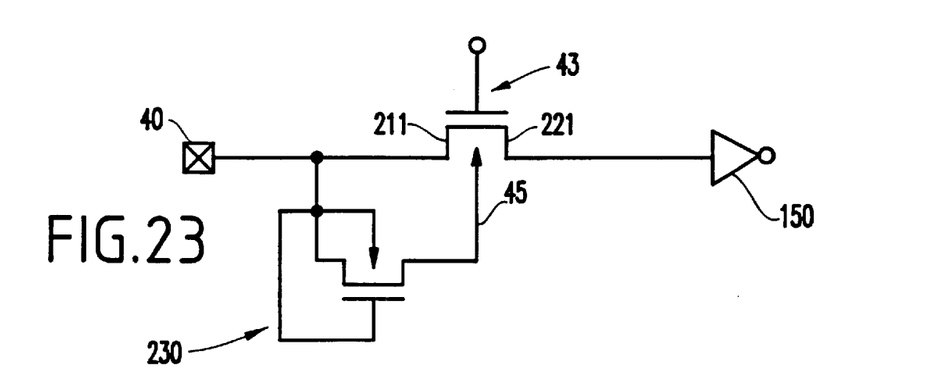
FIG. 23 is a schematic diagram of a B/G-C diode reference pass transistor.
Figure 24:
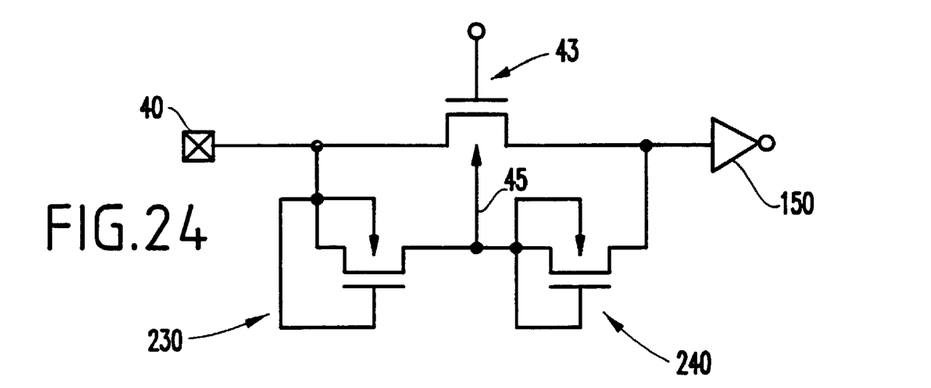
FIG. 24 is a schematic diagram of a B/G-C diode voltage divided-pass transistor.

Another embodiment of the invention is a body/gate coupled diode reference body pass transistor, as shown in FIG. 23. In this embodiment, the element for the "diode reference" circuit is a body-and gate-coupled MOSFET 230 whose gate, body and drain are connected. The B/G-C diode element is placed between the body 45 and the drain 211 of the pass transistor element 43. As in the prior embodiment, a second B/G-C diode element 230 is placed in parallel with the body 45 and source 221 of the pass transistor 43. The B/G-C reference network is then used to set the body 45 voltage of the pass transistor 45, which again provides the enhanced current drive and improves the delay of the pass transistor. This establishes a more voltage tolerant network, and provides a second current path to avoid pass transistor failure. As shown in FIG. 24, there can be more than one B/G-C element (e.g., 230, 240). Body- and gate-coupled elements have demonstrated a higher ESD robustness and lower turn-on voltage compared to Lubistor elements.

In charged device model (CDM) events, the current of the ESD pulse comes from inside the chip and looks for any path to get to the grounded pad. The current either comes from Vdd, Vss, or elements contained in the receiver circuit. In all of the cases, the pass transistor is typically an element in the path of failure. Hence, for CDM events, the identical issue is present but the elements (MOSFETs, references, diodes, B/G-C elements, resistors) role is reversed where the current is coming from the source instead of from the pad's side on the drain. The invention provides a new family of pass transistor logic circuits that are voltage tolerant and robust pass transistors in SOI and have performance delay advantages, current drive advantages and other functional concerns. These embodiments do not preclude addition of other elements for voltage tolerant gates which could be used in conjunction with these pass transistor elements, as would be known to one ordinarily skilled in the art given this disclosure.

While the invention has been described in terms of preferred embodiments, those skilled in the art will recognize that the invention can be practiced with modification within the spirit and scope of the appended claims.

What is claimed is:

1. A circuit comprising:
    a receiver;
    a silicon over insulator pass transistor having a source, a drain, and a body, wherein said source is connected to said receiver;
    a pad connected to said drain of said pass transistor; and
    a diode connected to said pass transistor, said diode including a cathode connected to said body of said pass transistor, and an anode connected to said pad and said drain of said pass transistor; wherein said diode comprises a unidirectional bipolar transistor, and wherein said receiver comprises an inverter.

2. The circuit in claim 1, wherein as voltage at said pad rises, said diode is adapted to forward bias and increase a voltage of said body of said pass transistor.

3. The circuit in claim 1, wherein when said diode is in a forward bias state, said diode is adapted to increase current drive to said pass transistor.

4. The circuit in claim 1, wherein when said diode is in a forward bias state, said diode is adapted to decrease a threshold voltage of said pass transistor.

5. The circuit in claim 1, wherein when said diode is in a forward bias state, said diode comprises a current path in series with said drain of said pass transistor.

6. A circuit comprising:
    a receiver;
    a silicon over insulator pass transistor having a source, a drain, and a body, wherein said source is connected to said receiver;
    a pad connected to said drain of said pass transistor; and
    a diode connected to said pass transistor, said diode including a cathode connected to said body of said pass transistor, and an anode connected to said pad and said drain of said pass transistors,
    wherein, when said diode is forward biased, a body-source junction of said pass transistor is adapted to comprise an additional diode in series with said diode; wherein said diode comprises a unidirectional bipolar transistor, and wherein said receiver comprises an inverter.

7. The circuit in claim 6, wherein as voltage at said pad rises, said diode is adapted to forward bias and increase a voltage of said body of said pass transistor.

8. The circuit in claim 6, wherein when said diode is in a forward bias state, said diode is adapted to increase current drive to said pass transistor.

9. The circuit in claim 6, wherein when said diode is in a forward bias state, said diode is adapted to decrease a threshold voltage of said pass transistor.

10. The circuit in claim 6, wherein when said diode is in a forward bias state, said diode comprises a current path in series with said drain of said pass transistor.

11. A circuit comprising:
    a receiver;
    a silicon over insulator pass transistor having a source, a drain, and a body, wherein said source is connected to said receiver;
    a pad connected to said drain of said pass transistor; and
    a diode connected to said pass transistor, said diode including a cathode connected to said body of said pass transistor, and an anode connected to said pad and said drain of said pass transistor,
    wherein, when said diode is forward biased, a body-source junction of said pass transistor is adapted to comprise an additional diode in series with said diode, such that said pass transistor comprises a body-coupled transistor in parallel with a series of diodes between said pad and said receiver; wherein said diode comprises a unidirectional bipolar transistor, and wherein said receiver comprises an inverter.

12. The circuit in claim 11, wherein as voltage at said pad rises, said diode is adapted to forward bias and increase a voltage of said body of said pass transistor.

13. The circuit in claim 11, wherein when said diode is in a forward bias state, said diode is adapted to increase current drive to said pass transistor.

14. The circuit in claim 11, wherein when said diode is in a forward bias state, said diode is adapted to decrease a threshold voltage of said pass transistor.

15. The circuit in claim 11, wherein when said diode is in a forward bias state, said diode comprises a current path in series with said drain of said pass transistor.

* * * * *